United States Patent
Brenner (10) Patent No.: US 11,667,404 B2
(45) Date of Patent: Jun. 6, 2023

(54) SYSTEM WITH A SELF-TEST FUNCTION, AND METHOD FOR VERIFYING THE SELF-TEST FUNCTION OF A SYSTEM

(71) Applicant: Airbus Defence and Space GmbH, Taufkirchen (DE)

(72) Inventor: Thomas Brenner, Taufkirchen (DE)

(73) Assignee: Airbus Defence and Space GmbH

( * ) Notice: Subject to any disclaimer, the term of this patent is extended or adjusted under 35 U.S.C. 154(b) by 235 days.

(21) Appl. No.: 17/120,699

(22) Filed: Dec. 14, 2020

(65) Prior Publication Data
US 2021/0188463 A1   Jun. 24, 2021

(30) Foreign Application Priority Data

Dec. 20, 2019   (DE) ...................... 10 2019 135 553.2

(51) Int. Cl.
| | |
|---|---|
| *B64F 5/60* | (2017.01) |
| *B64C 19/00* | (2006.01) |
| *B64D 45/00* | (2006.01) |
| *G01R 31/00* | (2006.01) |
| *G01R 31/317* | (2006.01) |

(52) U.S. Cl.
CPC ................ *B64F 5/60* (2017.01); *B64C 19/00* (2013.01); *B64D 45/00* (2013.01); *G01R 31/008* (2013.01); *G01R 31/31724* (2013.01); *B64D 2045/0085* (2013.01)

(58) Field of Classification Search
CPC ............. H02H 3/335; H02H 1/06; H02H 3/26
See application file for complete search history.

(56) References Cited

U.S. PATENT DOCUMENTS

| | | | |
|---|---|---|---|
| 6,445,188 B1 * | 9/2002 | Lutz ........................ | G01R 21/06 324/508 |
| 7,282,921 B2 * | 10/2007 | Sela ........................ | G01R 31/54 324/508 |

(Continued)

FOREIGN PATENT DOCUMENTS

| | | |
|---|---|---|
| DE | 10159633 A1 | 6/2003 |
| DE | 10392916 T5 | 8/2005 |
| DE | 102006008539 A1 | 8/2007 |

OTHER PUBLICATIONS

European Search Report for Application No. 20213994.5, dated May 18, 2021, 8 pages.

*Primary Examiner* — Mussa A Shaawat
(74) *Attorney, Agent, or Firm* — Lerner David LLP (57) ABSTRACT

A system with a self-test function has at least one system component which has at least one technical function, a fault simulation unit integrated in the system, a self-test unit integrated in the system, and a verification control unit integrated in the system, wherein the at least one system component is coupled to the fault simulation unit, wherein the fault simulation unit is designed to influence the operation of the system component to the effect that the at least one technical function is selectively impaired, wherein the self-test unit is designed to monitor operating parameters of the system component and to respectively generate a warning signal which indicates impairment of the respective at least one technical function, and wherein the verification control unit is designed to compare the warning signals generated by the self-test unit with expected warning signals on the basis of the impaired technical functions.

13 Claims, 9 Drawing Sheets

(56) References Cited

U.S. PATENT DOCUMENTS

| | | | |
|---|---|---|---|
| 2003/0172321 A1* | 9/2003 | Wolin | G06F 11/2215 |
| | | | 714/41 |
| 2005/0243484 A1* | 11/2005 | Kim | H02H 3/335 |
| | | | 361/42 |
| 2006/0150016 A1 | 7/2006 | Miller et al. | |
| 2008/0007879 A1* | 1/2008 | Zaretsky | H02H 3/335 |
| | | | 340/650 |
| 2008/0013227 A1* | 1/2008 | Mernyk | H02H 3/335 |
| | | | 361/42 |
| 2008/0022153 A1* | 1/2008 | Wang | H02H 3/335 |
| | | | 714/30 |
| 2009/0138772 A1* | 5/2009 | Bertacco | G06F 11/2236 |
| | | | 714/E11.155 |
| 2010/0013491 A1* | 1/2010 | Hooper | H02H 3/335 |
| | | | 324/509 |
| 2011/0078526 A1 | 3/2011 | Mohr et al. | |
| 2012/0257314 A1* | 10/2012 | Armstrong | H02H 3/335 |
| | | | 361/42 |
| 2014/0254050 A1* | 9/2014 | Haines | H02H 3/16 |
| | | | 361/42 |
| 2014/0347768 A1* | 11/2014 | Batko | H02H 3/044 |
| | | | 361/42 |
| 2015/0309103 A1* | 10/2015 | Ostrovsky | G01R 31/3277 |
| | | | 324/509 |
| 2015/0309105 A1* | 10/2015 | Ostrovsky | H02H 3/335 |
| | | | 324/509 |
| 2017/0025846 A1* | 1/2017 | Du | H02H 3/335 |
| 2017/0213680 A1* | 7/2017 | Simonin | H01H 71/04 |
| 2018/0128867 A1* | 5/2018 | Zhang | H02H 3/335 |
| 2019/0250210 A1* | 8/2019 | Sun | G01R 31/31724 |

* cited by examiner

Fig. 1

PRIOR ART:

SYSTEM WITH A SELF-TEST FUNCTION, AND METHOD FOR VERIFYING THE SELF-TEST FUNCTION OF A SYSTEM

FIELD OF THE INVENTION

The invention relates to a system with a self-test function and to a method for verifying the self-test function of a system.

BACKGROUND OF THE INVENTION

Aircraft and other means of transport or vehicles usually have comprehensive electronic equipment in the form of, for example, replaceable units (LRI, "Line Replaceable Item" or LRU, "Line Replaceable Unit"). For the correct operation of the aircraft, it is useful to equip such units with a self-test function in order to be able to promptly detect and eliminate possible malfunctions. The self-test function, which is also known as a BIT ("Built-in Test"), can be carried out before operating the aircraft or at regular intervals. The verification of the self-test function is usually provided after implementing the unit to be tested under laboratory conditions.

BRIEF SUMMARY OF THE INVENTION

It would be theoretically conceivable for such a self-test function to also be restricted by unforeseeable conditions. An aspect of the invention proposes a system with a self-test function, in which case the self-test function can also be verified.

A system with a self-test function is proposed, having at least one system component which has at least one technical function, a fault simulation unit integrated in the system, a self-test unit integrated in the system, and a verification control unit integrated in the system, wherein the at least one system component is coupled to the fault simulation unit, wherein the fault simulation unit is designed to influence the operation of the system component to the effect that the at least one technical function is selectively impaired, wherein the self-test unit is designed to monitor operating parameters of the system component and to respectively generate a warning signal which indicates impairment of the respective at least one technical function, and wherein the verification control unit is designed to compare the warning signals generated by the self-test unit with expected warning signals on the basis of the impaired technical functions. The verification control unit may also be designed to determine deviations from an expected result from a comparison. These deviations could indicate an impairment of the self-test unit.

There may be, in particular, a plurality of system components which are connected to one another or interact with one another in another manner in order to form the system. The system to be tested may be of any desired nature and may have mechanical and electronic system components. However, a main focus is on the self-test function of electronic system components, as stated further below. However, there is initially no such restriction in a general embodiment.

An important component is the fault simulation unit which can selectively restrict individual technical functions of individual system components in a targeted manner, with the result that the relevant system component having the respective technical function leaves an intended operating range. This event should be detected by the self-test unit in order to generate a corresponding warning signal as a result of this. The self-test unit therefore monitors relevant operating parameters which can be assigned to the respective impaired technical functions. It may be a separate component part or an integrated component part which is coupled to the at least one system component or an algorithm integrated in the system. The self-test unit has information relating to the normal operating behaviour when technical functions are not impaired. A deviating operating behaviour can be determined by comparing an operating parameter resulting in response to the technical impairment with a normal magnitude of the relevant operating parameter, which results in the generation of a warning signal.

The verification control unit is meanwhile provided for the purpose of comparing the warning signals which are generated by the self-test unit with the expected warning signals. If technical functions are consequently selectively impaired in such a manner that an operating range is left and a warning signal would have to be generated, the verification control unit can verify the generation of the warning signal. If the latter is not generated, there is a malfunction in the self-test unit.

The fault simulation unit, the self-test unit and the verification control unit are linked to one another in such a manner that the fault simulation unit, for example, impairs a plurality of different technical functions in succession and informs the verification control unit that there is such a restriction. The verification control unit is consequently able to receive and analyse a corresponding warning signal. Reception can be effected directly or indirectly, for example via a subsequently mentioned monitoring unit. It is conceivable that the verification control unit can correlate individual warning signals, impairments of technical functions and received warning signals with one another in order to then store a resulting state matrix, to transmit it to the outside or to display it.

In this context, a warning signal could also comprise more than merely a warning per se. The warning signal could actually comprise information relating to technical restrictions which allow a statement to be made regarding which technical function is restricted. This information could likewise be examined by the verification control unit in order to make a statement regarding whether correct warning signals which can also be uniquely assigned to the respective technical restriction are output.

Overall, the system according to an embodiment of the invention is very advantageous on account of the verifiable self-test function in the self-test unit. As a result of the very simple possible way of simulating different faults, the self-test unit can be reliably tested. It is appropriate in this case to make all technical functions stated in a specification checkable. This results in a plurality of advantages:

The verification can encompass, in particular, the complete range of functions of the relevant system. It would be economically unproblematic to increase, for example, the large number of transistors present in complex electronic systems anyway and in the process to verify all functional BIT ("Built-In Test") requirements in detail. This increases the trust in safety-relevant systems.

The trustworthiness of the self-test function may be increased, the simpler the self-test function is. Conversely, the degree of trust in a self-test function might fall with the number of assumptions on which this verification is based and the number of logical conclusions required. The system according to the invention can considerably increase the trust by means of fault simulation which is as realistic as possible.

The system according to an embodiment of the invention could be suitable as a "failsafe" system. Failure of the operational hardware can be detected by the self-test function. Failure of the self-test function can likewise be verified with the aid of the fault simulation unit and the verification control unit. Failure or incorrect activation of a fault simulation is detected by the self-test function. The fault simulation and the self-test function can therefore monitor one another. The principle of mutual monitoring comes into its own here.

The system according to an embodiment of the invention can also be used in a flexible manner. The fault simulations can be controlled and monitored via a processor, as explained further below. This provides the possibility of also modifying the verification process subsequently, for example in the operating phase of the system, via software executed in the processor.

The system according to an embodiment of the invention is also cost-effective. It becomes considerably more cost-effective since no further system must be sacrificed for verification purposes. The actual hardware could result in marginally higher costs of the individual system by virtue of the fault simulation unit, the self-test unit and the verification control unit being integrated.

The impairment of a technical function should be understood as meaning the fact that an intended function is not performed by the system component as expected. For this purpose, a component part of the relevant system component, for instance, could be disrupted by applying incorrect input variables, interrupting or disrupting a logic circuit or changing an output variable, for example by changing electrical variables, or similar measures.

In principle, a plurality of requirements relating to how the units mentioned above interact in order to verify the self-test function may be imposed on the system according to an embodiment of the invention. The selective impairment of a technical function by the fault simulation unit should be as realistic as possible, for instance. A plurality of realistic impairments which could actually also occur during operation of a system should therefore be able to be realistically implemented by the fault simulation unit. These should also be able to be implemented under real operating conditions, as becomes even clearer further below in connection with a stimulation unit. It is also useful to systematically integrate impairments of technical functions which are suitable for carrying out a complete self-test of the system.

The fault simulation unit should also be implemented in such a manner that no secondary effects which go beyond the intended impairment of a technical function occur. The fault simulation unit is therefore configured, in a targeted manner and—in other words—in a preferred manner, to implement different impairments in succession, in particular. If the fault simulation unit is deactivated, there should still be no impairment whatsoever for the system. This can be supplemented by means of an isolating unit described further below. The fault simulation unit is designed, in particular, to be permanently deactivated during real operation of the system.

In one particularly preferred embodiment, the at least one system component is in the form of an electrical or electronic system component. These may comprise different types of system components which are each electrically connected to other system components or other systems and interact with them in a predefined manner. In addition to simpler electrical system components such as resistors or electrical lines, simple electronic system components such as inductances, capacitances, transistor circuits, rectifiers, amplifier circuits and the like may also be meant. However, more complex integrated circuits, which could range from microcontrollers to complex processors, or circuits having microcontrollers and processors integrated therein are also conceivable. Electrical or electronic system components which need to be tested by the self-test unit may each be selectively influenced in order to selectively interrupt individual electrical connections or to establish electrical connections which are usually not provided.

In one preferred embodiment, the at least one system component has digital electronics. Digital electronics may be, in particular, in the form of a complex integrated circuit and, in particular, in the form of a processor unit or a computing unit. Digital electronics are based on a logical circuit with binary state patterns or sequences. In this case, the fault simulation unit may be designed to influence individual sections of the digital electronics in such a manner that state patterns or sequences of binary signals are changed. This can be achieved, inter alia, by influencing logic gates, influencing an electrical output of logic gates or by means of other measures. Additional components, in particular transistors, can be integrated in the system in order to implement the fault simulation unit. The number of transistors in a processor unit or computing unit is only marginally increased thereby. The additional components are used for the selective, controlled impairment, in particular of signal flows or the supply of adjacent components.

In one advantageous embodiment, the fault simulation unit has at least one electronically controllable fault simulation cell which is respectively integrated in the at least one system component and is designed to selectively open a line of the relevant system component or to selectively close a connection of the relevant line to another line or to an additional electronic component. The actual selective opening of a line can be used to interrupt a signal line, a power line or the like, with the result that the self-test unit can react by determining a missing signal or another impairment. Furthermore, a fault simulation cell could also establish a connection which is not usually provided. For instance, a bridging of two adjacent connections of an integrated circuit or the like could thus be simulated. In a simple case, the fault simulation cell has an electrical switch. In one preferred embodiment, this could be in the form of an electronic switch, in particular based on an AND gate. Complex systems may have a whole string of fault simulation cells which can selectively impair a plurality of technical functions in order to implement a complex self-test function.

By way of example, the other line may have an earth line or a connection to the logic level "1". The detection of a connection of a line of the system component to an earth line could indicate, for example, inadequate electrical insulation, which could originate from a mechanical fault.

Furthermore, in one advantageous embodiment, the additional electronic component could be selected from a group of electronic components, the group having: a resistor, a capacitance, an inductance, analogue filters, digital filters, logic modules, bridging lines, voltage sources or mixed forms thereof. Such electronic components can be used, in particular, to interrupt, restrict or change electrical connections. It is therefore possible to simulate signal interference relating to a representative conceivable fault, for example.

In one particularly advantageous embodiment, the fault simulation unit has an external control unit and an internal control unit which can be connected to the external control unit, wherein the at least one fault simulation cell is arranged in the internal control unit and can be controlled by the external control unit, and wherein the at least one fault simulation cell and/or the internal control unit is/are designed such that the at least one fault simulation cell is not connected without a connection to the external control unit. The division into an external control unit and an internal control unit is particularly useful when implementing a larger number of fault simulation cells. The fault simulation cells mentioned above are assigned to the internal control unit and are connected, for example, to control lines which end in a connection which can be connected to a corresponding connection of the external control unit. In contrast, the external control unit could be designed differently depending on the complexity of the system to be tested. On the one hand, the external control unit could have, for example, individual buttons, switches or the like which can be connected to the control lines. A user could then selectively control individual fault simulation cells in a targeted manner by actuating switches or buttons and could therefore simulate corresponding faults. On the other hand, in the case of more complex systems in particular, the external control unit could have a processor unit, a computing unit or the like which is designed to automatically execute a particular test program. Corresponding control commands which reach the internal control unit would be emitted according to a predefined scheme which could be predefined, for instance, by an approval rule of the system. The individual fault simulation cells can be controlled there on the basis of the control commands. The particular advantage of the division is that the system is not able to actuate the switching units without the external control unit. Fault simulation cells which have not been actuated are in the normal operating state in this case and the system can be operated solely in a conventional manner without the external control unit. The external control unit can be controlled by the verification control unit, can be integrated in the latter or can be implemented by means of the verification control unit.

The at least one fault simulation cell preferably has an electronic switch. In contrast to electromechanical switches, electronic switches are implemented only electronically and therefore also do not have the disadvantages of electromechanical switches. The electronic switches can be implemented, for example, using transistor, diode, thyristor and other semiconductor circuits. The system could be completely embedded in the integrated circuit, in particular when implemented as a digital circuit, in order to allow an improved self-test function by fundamentally making it possible to verify the self-test function. When conceiving or designing the system, the fault simulation cells can consequently be directly taken into account, with the result that subsequent modification of a newly developed system for implementing the self-test verification is actually no longer necessary. Therefore, if an electronic system, in particular, is meaningfully designed and conceived, costs and effort can be considerably saved and the self-test function can be verified.

Further advantageously, the system may also have at least one isolating unit for electrically isolating one of the at least one system component to be tested from other system components if necessary. In order to prevent an unexpected behaviour of different system components, it may be appropriate to electrically isolate individual system components from other system components when examining said individual system components. The self-test unit could test properties of the relevant system component, for example during execution of a particular test scheme, while the other system components are isolated from the relevant system component. If the parameters of the relevant system component which are to be tested have been successfully tested, the isolation can be cancelled. As a result, the system component is changed to the normal operating state. This could be gradually carried out for all further system components.

The system preferably also has a stimulation unit which can be connected to the at least one system component and is designed to simulate input variables for the relevant system component. The stimulation unit is intended to provide an electrically isolated system component, in particular, with particular input variables. If the relevant system component interacts, for instance, with other system components during normal operation and has a behaviour which depends on the input variables, a self-test process can be carried out only when the relevant system component is supplied with the correct input variables. These input variables may be of any desired nature and depend completely on the type of system. In addition to voltages, signals, electrical states and the like, data may naturally also be provided. The stimulation unit is consequently tuned to the system and is controlled by the fault simulation unit or the verification control unit. The relevant system component then no longer differs from operational operation in terms of its operation.

In one particularly preferred embodiment, the system also has a monitoring unit which is designed to record a reaction of the system. For example, the monitoring unit may be designed to record a reaction of the system to a stimulus performed by the stimulation unit. For example, the monitoring unit may also be designed to record a reaction of the system to a fault simulation. The monitoring unit is preferably designed to compare the reaction with an expected reaction and to output a message as soon as the reaction deviates from an expected reaction. A fault in the stimulation unit or in the system itself can also be detected thereby. The monitoring unit may be implemented separately or may be integrated in the self-test unit and/or the verification control unit.

The invention also relates to a method for checking self-test functions in a system, having the steps of: influencing the operation of at least one system component by means of a fault simulation unit integrated in the system, with the result that a technical function is selectively impaired, monitoring operating parameters of the system component by means of a self-test unit integrated in the system and generating a warning signal which indicates impairment of the respective technical function, comparing the generated warning signal with expected warning signals on the basis of the impaired technical functions by means of a verification control unit, and outputting a warning notice if the generated warning signal does not correspond to an expected warning signal.

The process of influencing operation preferably comprises selectively opening a line of the relevant system component or selectively closing a connection of the relevant line to another line or to an additional electronic component.

In one advantageous embodiment, the method may also have the step of electrically isolating the relevant system component at least while influencing operation.

The method particularly preferably also comprises simulating input variables for the relevant system component by means of a stimulation unit which can be connected to the at least one system component.

The invention also relates to an aircraft having at least one system mentioned above. In particular, the system may be an electronic system. A possible hierarchical breakdown of the hardware in an aircraft may comprise a) the system itself, that is to say the aircraft here, b) a subsystem, for instance avionics, c) an "LRI", d) an "SRI" and e) an electronic component, for example an integrated circuit. Electronic devices such as navigation computers or transponders are often accommodated in housings in an aircraft and can be directly replaced in the event of a defect and can therefore be called "Line Replaceable Items" (LRI). Such an LRI may consist of individual modules which are called "Shop Replaceable Items" (SRI) since defective modules can or should be changed only in the workshop. An SRI could generally be a subfunction group of the LRI. The SRIs generally communicate with one another via a system bus which is shown further below in FIG. 3. This can be applied to all levels.

BRIEF DESCRIPTION OF THE DRAWINGS

Further features, advantages and possible uses of the present invention emerge from the following description of the exemplary embodiments and from the figures. In this case, all features described and/or graphically illustrated form the subject matter of the invention alone and in any desired combination, even irrespective of their composition in the individual claims or their dependency references. In the figures, identical reference signs still represent identical or similar objects.

DETAILED DESCRIPTION

Figure 1:
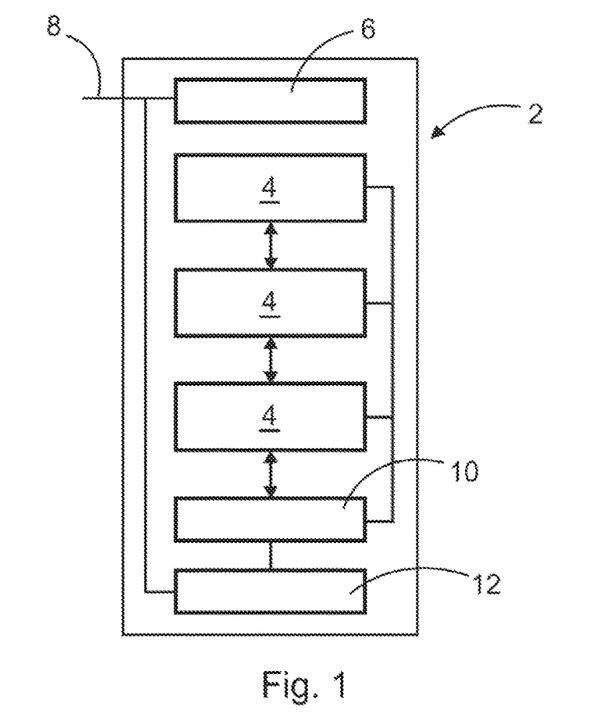
FIG. 1 shows a schematic, block-based illustration of a system according to an embodiment of the invention.

FIG. 1 very schematically shows a system 2 with a self-test function. It should be pointed out that this illustration is intended to be used only to understand the general structure of the system 2 according to the invention and is therefore not very detailed. Various details of the system are illustrated in the figures further below.

The system 2 has a number of system components 4 which can each perform at least one technical function. By way of example, the system components 4 are functionally coupled to one another, with the result that they can interact with one another in order to implement the system 2. The system 2 additionally has a self-test unit 6 which is connected to the system components 4. This connection may comprise, for example, an electrical connection to signal-carrying and/or voltage-carrying lines of the system components 4. As a result, the self-test unit 6 is intended to be able to monitor or test particular technical functions of the system components 4 in order to thereby assess whether corresponding system parameters are in an expected range. The self-test unit 6 can provide therefrom, for example, a warning signal at a first output 8, which warning signal indicates whether a particular operating parameter deviates from unexpected behaviour.

In order to verify the self-test unit 6, a fault simulation unit 10 and a verification control unit 12 are additionally provided. The fault simulation unit 10 is coupled to the individual system components 4 and is designed to influence the operation of the system components 4 to the effect that the respective, at least one technical function is selectively impaired. As explained further below, the impairment can be effected by means of different measures.

The fault simulation unit 10 is controlled by the verification control unit 12. Furthermore, the verification control unit 12 is designed to compare the warning signals generated by the self-test unit 6 with expected warning signals which depend, for instance, on the respectively impaired technical function. For this purpose, the verification control unit 12 may have knowledge of a test scheme which may comprise a test pattern having a plurality of steps to be run through in order to impair particular functions of the system components 4. The verification control unit 12 could furthermore also be able to control the fault simulation unit 10 to carry out a test scheme. Consequently, different faults can be simulated in succession in order to then receive the warning signals from the self-test unit 6 which are output in response to the simulated faults and to compare them with the expected warning signals. If, for instance, a warning signal is missing in the case of a particular simulated fault or if a warning signal corresponding to the simulated fault is provided with unexpected information, a relevant defect of the self-test unit 6 can be assumed. The system 2 is therefore able to reliably carry out a self-test and to also reliably check the self-test function if necessary.

Figure 2A:
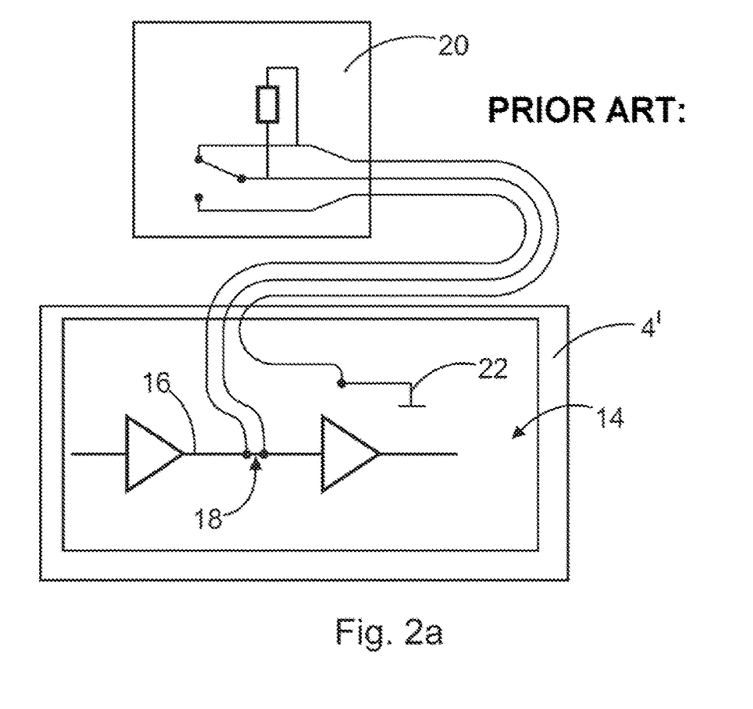
FIGS. 2a and 2b show a principle of fault simulation according to the prior art (FIG. 2a) and according to an embodiment of the invention (FIG. 2b).
Figure 2B:
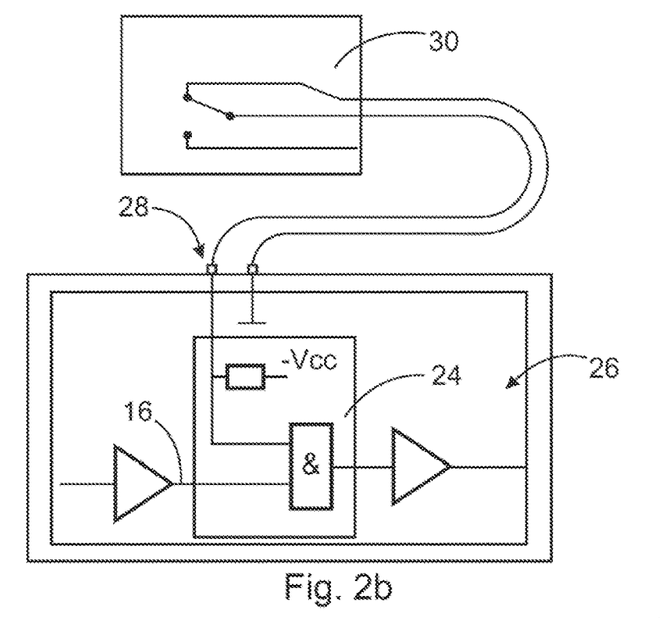

FIGS. 2a and 2b illustrate how a technical function of a system component can be impaired. FIG. 2a shows the prior art. A conventional system component 4' having a simple circuit 14 with a line 16 is shown here. In order to test a self-test function, a line is manually interrupted in an intersection 18 and is connected to a switch 20, for example by means of soldering. The line 16 is connected to an earth line 22 here, by way of example, or is closed, that is to say is bridged by the switch 20. In this case, the switch 20 is usually outside the system component 4' or the superordinate system in order to be easily accessible for the operator. Furthermore, it is possible to achieve the situation in which a housing of the system is closed during operation in order to reproduce the real application as well as possible. The self-test function may detect a malfunction of the system component 4' and may output a corresponding signal. Such a procedure is conceivable under certain circumstances for simple system components 4', but such manual disconnection of a line 16 is not possible, in particular, in complex circuits and in the case of a plurality of layers of a circuit board. Changed line routing caused by the switch 20 may result in impairment of the signal transmission behaviour in terms of propagation time and frequency response and possibly in increased crosstalk with respect to adjacent signals in the case of high-frequency signals, as can be found in modern electronic circuits for instance. Such a simulation circuit is acceptable for verification purposes only on the assumption to be verified that the impairment of the signal transmission by the switch is within the tolerance limits specified for the transmission line. In addition, this procedure can be used only to verify a self-test once under laboratory conditions, with the result that it would not be possible at all to check the self-test after activating the system 2.

As shown in FIG. 2b, a system component 4 of the system 2 according to the invention meanwhile has a fault simulation cell 24 in the form of an electronic switching unit which forms an integral part of a circuit 26 of the system component 4. The fault simulation cell 24 is electronically controllable and has, for this purpose, a connection pair 28, for example, which can be advantageously implemented by means of a test connection on a housing. A switch 30 can be connected to the connection pair 28. Through actuation of the switch 30, the fault simulation cell 24 opens the corresponding line 16. The particular advantage of the circuit is that the signal transmission properties of the line 16 such as frequency response and signal propagation time and crosstalk are no longer determined by the cables connecting the switch 30 to the connection pair 28, but rather only by the fault simulation cell 24. The fault simulation cell 24 is ideally fitted in the region of the line 16, with the result that the line routing of the line 16 need not be significantly modified for the simulation unit and the signal transmission properties therefore need not be changed substantially either. The fault simulation cell 24 is an integral part of the system and the signal transmission properties of the fault simulation cell 24 are therefore taken into account during system design, with the result that they do not impair the system function. Such a fault simulation cell can be used as a standard fault simulation cell at a plurality of locations in a system 2.

Figure 6A:
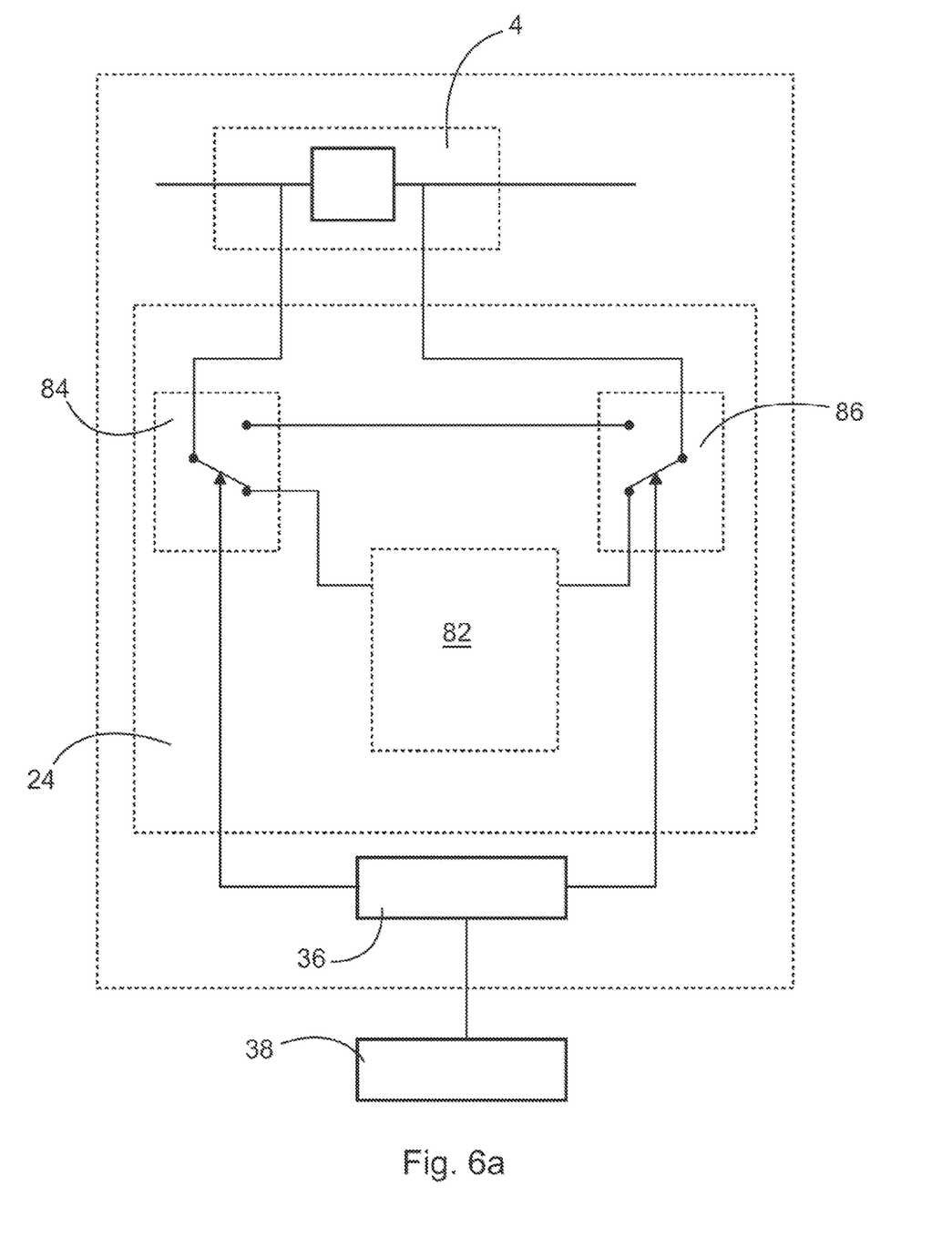
FIGS. 6a to 6c show further examples of the fault simulation in a system.

In a generalization of the fault simulation cell 24, it is possible to define a fault simulation cell 24 which could have a fault activation unit and a modification unit, as explained further in FIG. 6a. The fault activation unit may typically have electronic switches which can connect or disconnect the modification unit, wherein the modification unit determines the type of fault simulation.

A further particular advantage is that the fault simulation cell 24 is in the form of an AND gate in the example shown, which AND gate disconnects the connection and thereby simulates a fault only when a switch 30 is activated and connected. If the switch 30 is not connected to the connection pair 28, the connection is always maintained. The system component 4 is then operated in a conventional manner.

At this point, it shall be noted that the circuit 26 may be an integrated circuit having a large 6-digit, 7-digit or 8-digit number of transistors, and the fault simulation cell 24 is only in the form of an additional logic gate and consequently virtually does not change the complexity of the circuit 26. In addition, such a switching unit 24 is required only at a few, representative locations of the circuit 26.

Figure 3:
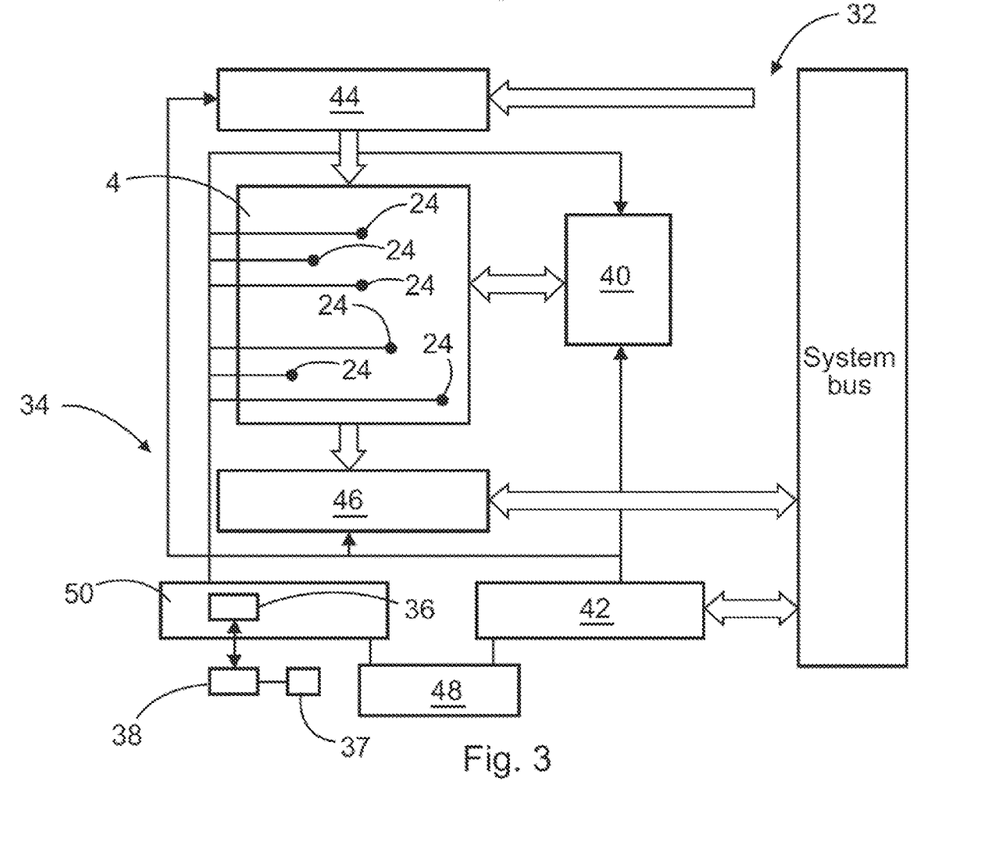
FIG. 3 shows a schematic illustration of a further system according to an embodiment of the invention.

FIG. 3 shows a system 32 which corresponds to the system 2, but has only a single system component 4, by way of example. This may be, for example, a printed circuit board or a highly complex integrated circuit, for example an embedded processor. A verification control unit 50 is connected to a plurality of fault simulation cells 24 which are arranged in the system component 4 in a similar manner to FIG. 2b. For this purpose, the verification control unit 50 is coupled to a fault simulation unit 34, wherein the switches 30 are assigned to the fault simulation unit 34 or are implemented by means of the latter.

In addition to a multiplicity of fault simulation cells 24, the fault simulation unit 34 could have a single control device or an internal control unit 36 and an external control unit 38. When using a very large number of fault simulation cells 24 in particular, it is appropriate for the external control unit 38 to initiate a process of verifying the self-test function, for example, wherein the external control unit 38 continuously transmits information to the internal control unit 36 relating to which of the fault simulation cells 24 should be respectively controlled. In order to prevent impairments of other system components, the system 32 additionally has an isolating unit 40. This can electrically isolate the system component 4 to be tested from other system components 4 if necessary.

A self-check may comprise both self-monitoring and a self-test. In both cases, the system can be monitored by means of a monitoring function 42, wherein the system is additionally exposed to a stimulus from a stimulation unit 44 during the self-test.

In order to carry out the self-test, a self-test unit 42 is provided and is coupled to the system component 4, the isolating unit 40, the stimulation unit 44 and a monitoring unit 46. The stimulation unit 44 is provided for the purpose of transmitting various signals to the system component 4, with the result that the required input variables are present and a particular behaviour which can be detected by the monitoring unit 46 can be triggered in the system component 4. This is useful, in particular, when the isolating unit 40 completely isolates the system component 4 from the interaction partners usually present during normal operation. By means of stimulation with the aid of test signals, the self-test unit 42 can consequently test the behaviour of the system component 4 under real conditions and can output a fault message if the behaviour of the system component 4 does not correspond to the expected behaviour. The fault message may be forwarded via a system bus. The fault message may also be stored in a non-volatile memory 48 in a manner provided with a time stamp. The memory contents can be queried via a serial interface available on a test connector 37. The history of the fault messages is then available for maintenance purposes.

Figure 4A:
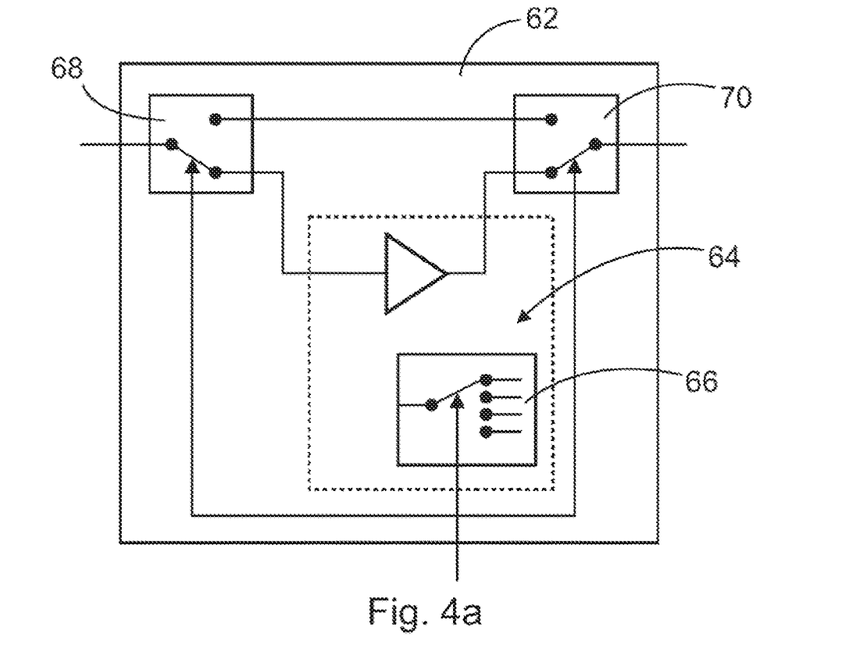
FIGS. 4a to 4b show two examples of influencing a technical function of a system component.

Different variants can be considered when influencing system components, in particular in complex circuits. FIG. 4a shows, by way of example, a fault simulation cell 62 as a switching unit which is simultaneously equipped with a filter module 64 which can be controlled via a selection module 66. Two switches 68 and 70 may either loop through an incoming signal between an input 72 and an output 74 or can pass it through the filter module 64. The filter module 64 can be used to manipulate a signal, with the result that malfunctions of assemblies can be simulated in a targeted manner.

Figure 4B:
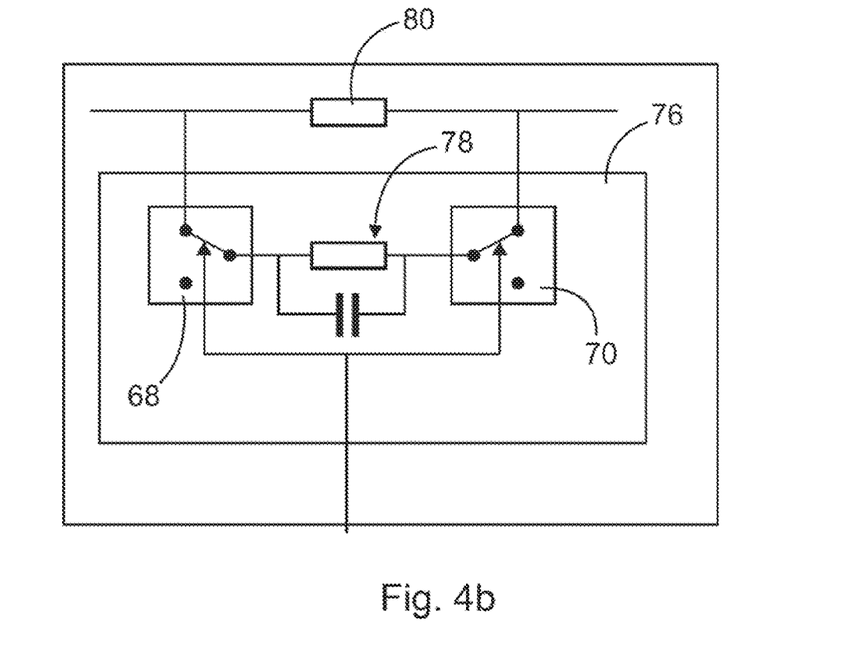

FIG. 4b shows, by way of example, a fault simulation cell 76 which is equipped with an RC element 78 which can be connected in parallel with a system component 80 via the two switches 68 and 70. The RC element 78 can be connected in parallel or disconnected by changing the switches 68 and 70. Particular fault scenarios can be simulated in a targeted manner by suitably dimensioning the RC element 78.

Figure 5A:
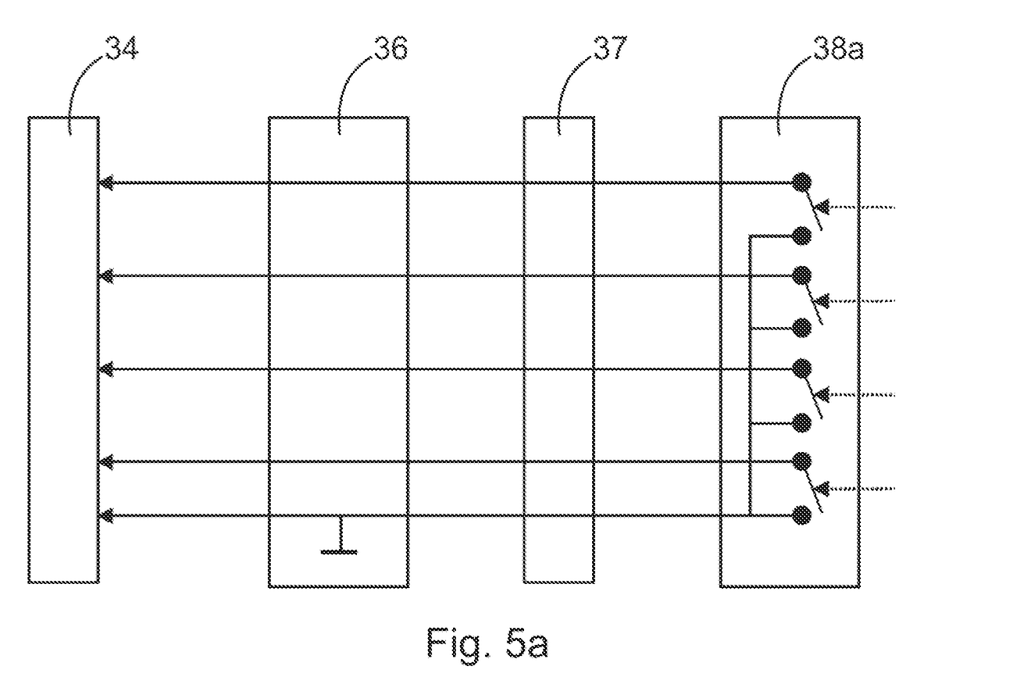
FIGS. 5a to 5d show a plurality of examples for controlling a fault simulation unit.

FIG. 5a shows a variant of the external control unit 38 in the form of a switch box 38a having a plurality of externally operable switches which can be connected to the internal control unit 36 and, as a result, to the fault simulation unit 34 via the test connector 37.

Figure 5B:
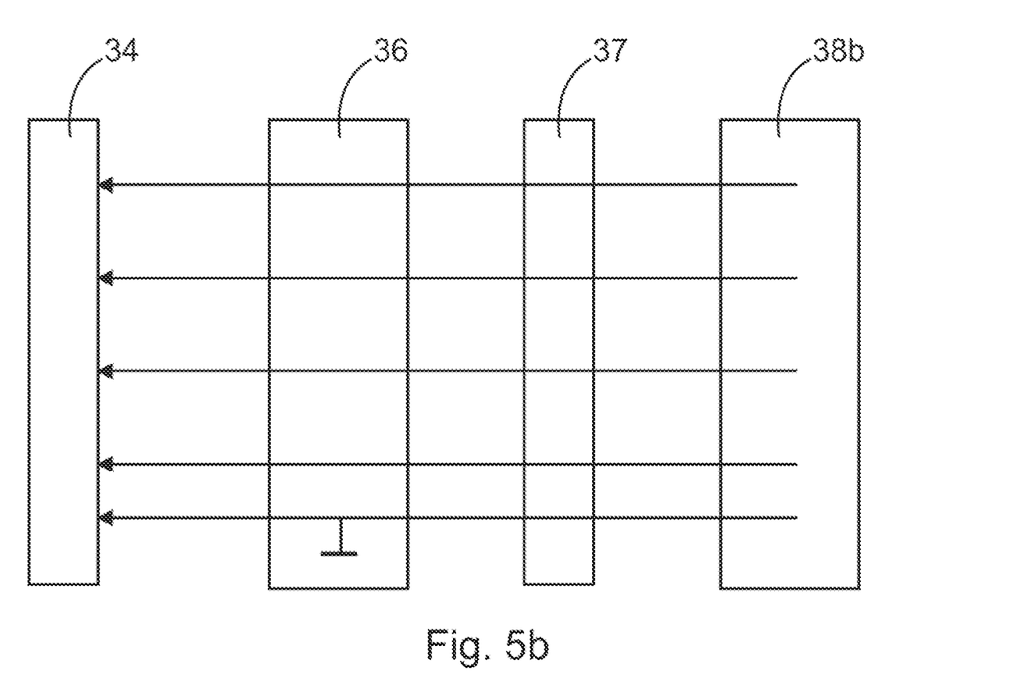

FIG. 5b shows an equivalent structure to FIG. 5a, but an external control device 38b for discrete control signals is provided there instead of a switch box 38a. This can automatically carry out the verification process.

Figure 5C:
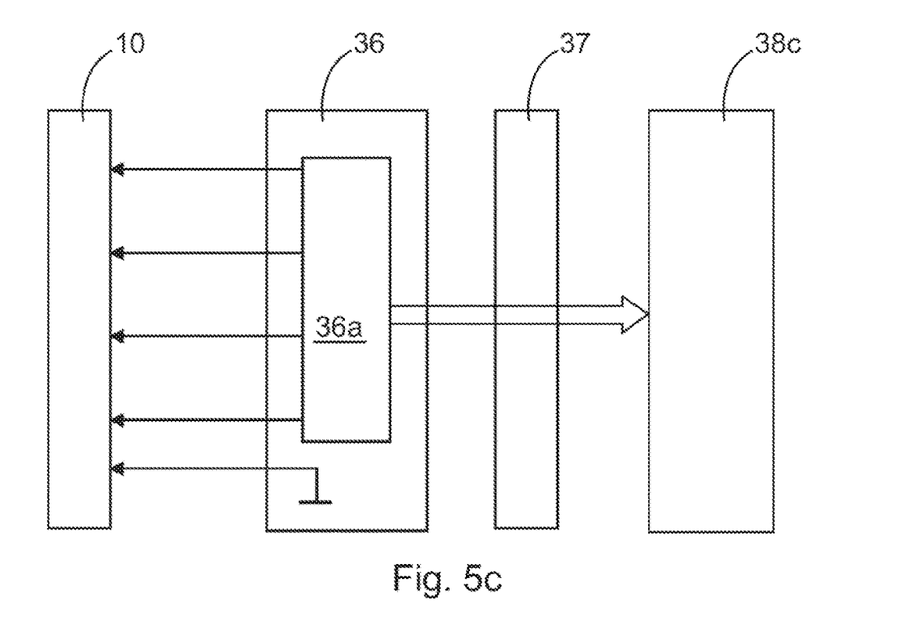

FIG. 5c shows a structure which is equivalent to that in FIG. 5b. However, individual control lines are not individually routed out via the test connector 37, but rather via a serial interface 36a. An external control device 38c activates the individual fault simulation cells 24 in the fault simulation unit 10 via the serial interface 36a.

Figure 5D:
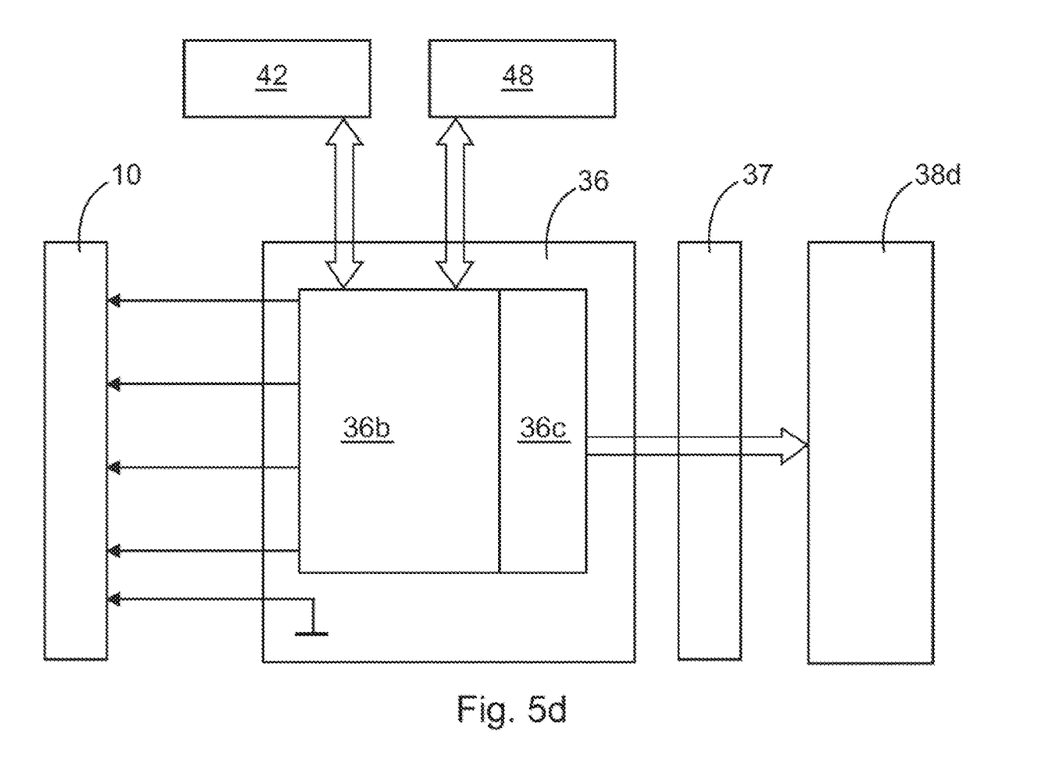

FIG. 5d shows a variant which is based on FIG. 5c and in which an external control device 38d is in the form of a microcontroller 36b. The latter is connected to the outside world via the test connector 37 by way of a serial interface 36c. The microcontroller 36b communicates with the self-test control unit 42 and stores the verification results in the memory 48.

FIG. 6a shows a basic structure of a fault simulation cell 24. Here, a system component 4 to be influenced can be actively influenced if necessary via a modification unit 82 which can be connected to the system component 4 via switches 84 and 86. The switches 84 and 86 which can be used to activate the fault simulation can therefore be referred to as a fault activation unit. They can be controlled by the internal control unit 36 which has a signal connection to the external control unit 38.

Figure 6B:
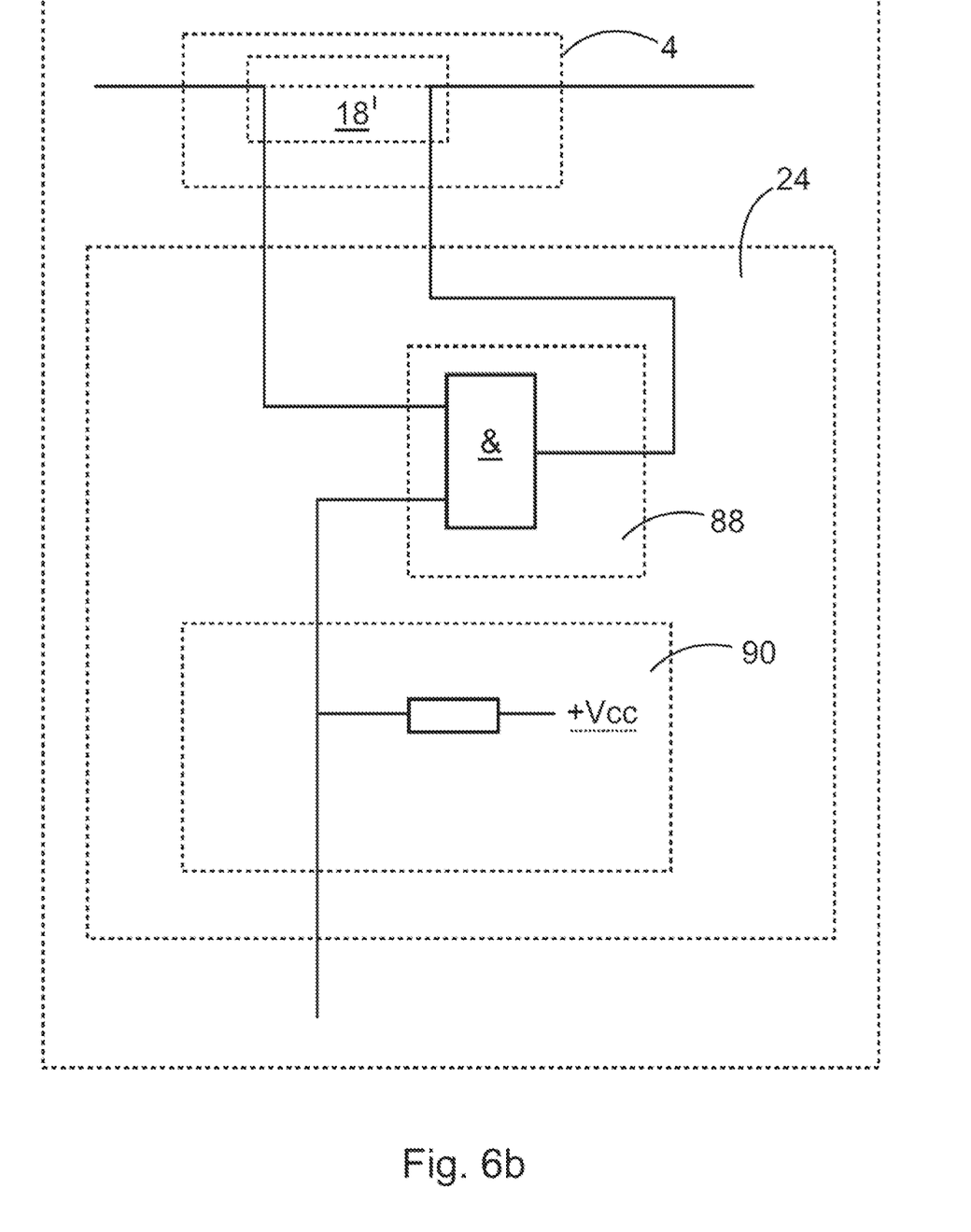

FIG. 6b shows the fault simulation cell 24 for simulating the interruption in a line which is shown here as a system component 4 to be influenced. The line has a disconnection point 92 which is linked to a fault activation unit 88 and a modification unit 90. Instead of using two switches 84 and 86, the fault activation unit 88 has an AND gate which is already shown, for instance, in FIG. 2b.

Figure 6C:
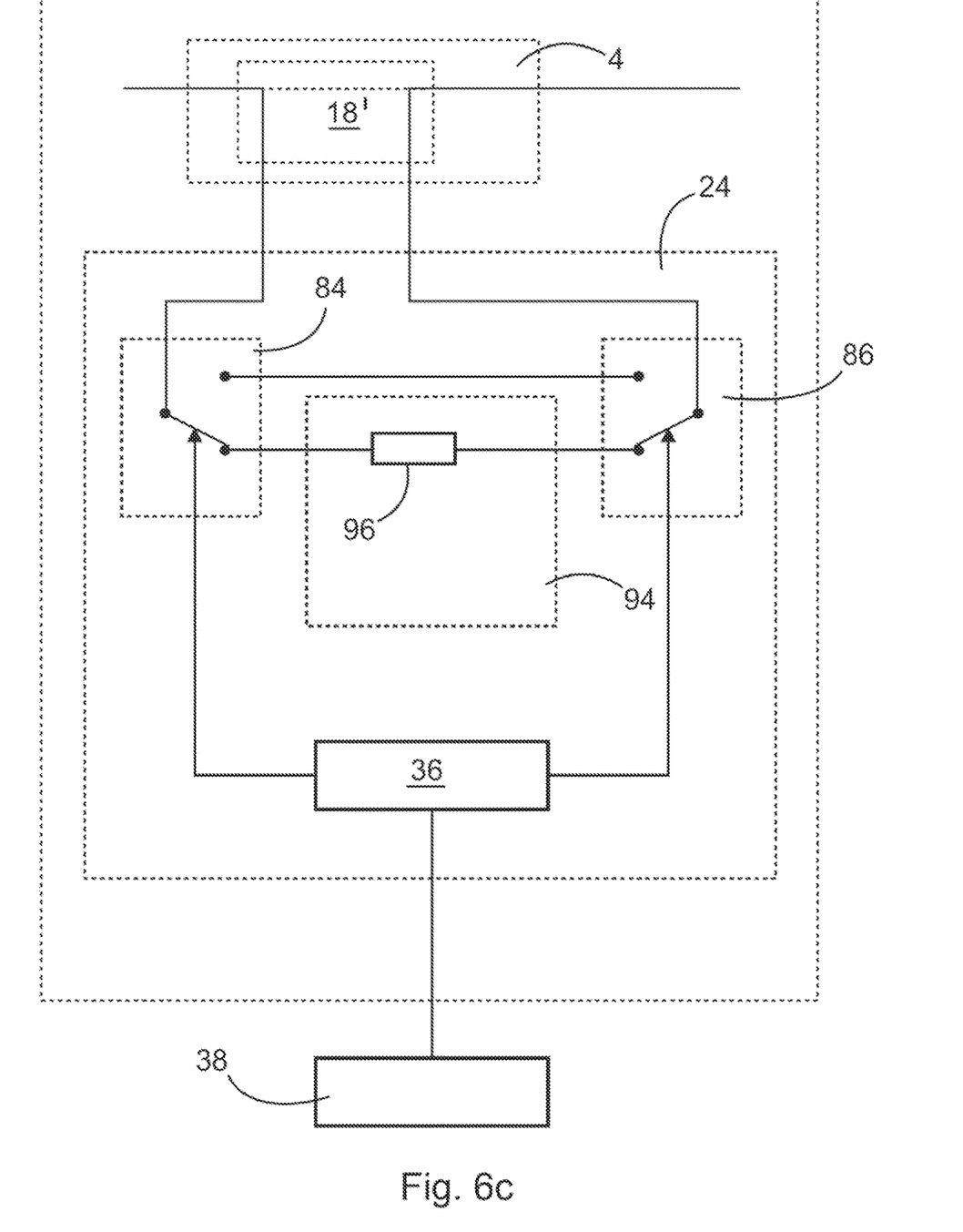

FIG. 6c shows the implementation of an increased line resistance as a modification of the illustration from FIG. 6b. A modification unit 94 has a resistor 96 which bridges the disconnection point 92, if necessary, via the switches 84 and 86.

Figure 7:
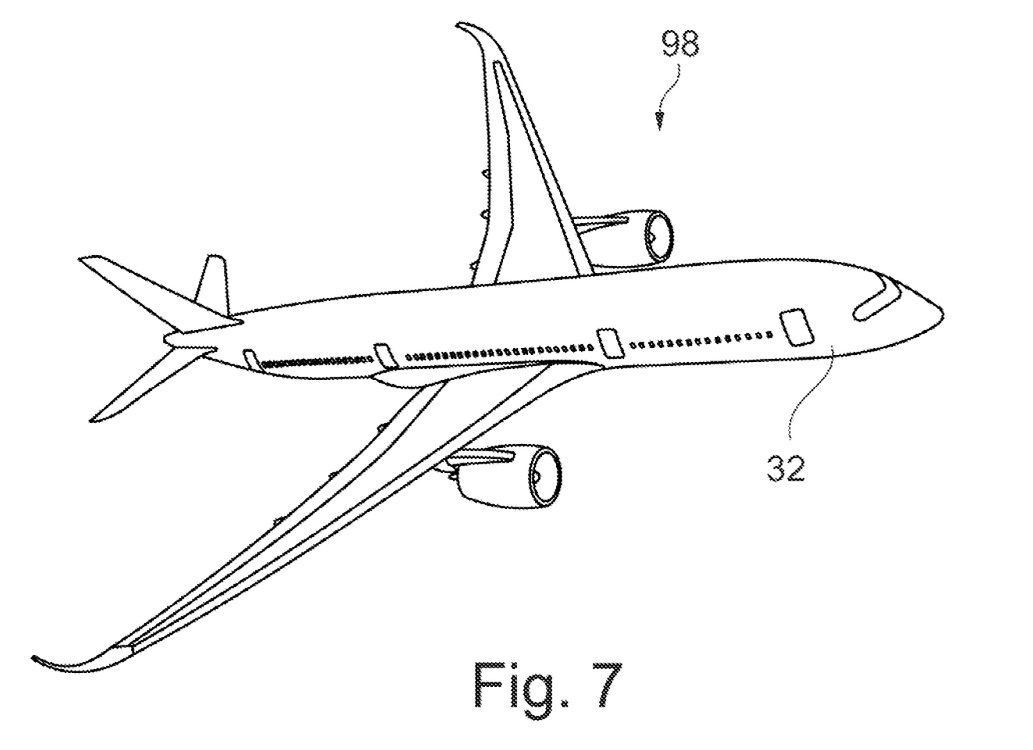
FIG. 7 shows an aircraft.

Finally, FIG. 7 shows an aircraft 98 which is equipped, for example, with a system 32 according to the invention which forms part of the avionics.

It shall be additionally pointed out that "having" does not exclude any other elements or steps and "a" or "an" does not exclude a multiplicity. It shall also be pointed out that the features which have been described with reference to one of the exemplary embodiments above can also be used in combination with other features of other exemplary embodiments described above. Reference signs in the claims should not be considered to be a restriction.

While at least one exemplary embodiment of the present invention(s) is disclosed herein, it should be understood that modifications, substitutions and alternatives may be apparent to one of ordinary skill in the art and can be made without departing from the scope of this disclosure. This disclosure is intended to cover any adaptations or variations of the exemplary embodiment(s). In addition, in this disclosure, the terms "comprise" or "comprising" do not exclude other elements or steps, the terms "a" or "one" do not exclude a plural number, and the term "or" means either or both. Furthermore, characteristics or steps which have been described may also be used in combination with other characteristics or steps and in any order unless the disclosure or context suggests otherwise. This disclosure hereby incorporates by reference the complete disclosure of any patent or application from which it claims benefit or priority.

REFERENCE SIGNS

2 System
4 System component
4' Conventional system component
6 Self-test unit
8 First output
10 Fault simulation unit
12 Verification control unit
14 Circuit
16 Line
18 Intersection
20 Switch
22 Earth line
24 Fault simulation cell
26 Circuit
28 Connection pair
30 Switch
32 System
34 Fault simulation unit
36 Internal control unit
36a Control unit with a serial interface
36b Microcontroller
36c Serial interface for microcontroller
37 Test connector
38 External control unit
38a Switch box
38b External control device for discrete control signals
38c External control device with a serial interface
38d External control device
40 Isolating unit
42 Self-test unit
44 Stimulation unit
46 Monitoring unit
48 Memory
50 Verification control unit
62 Fault simulation cell
64 Filter module
66 Selection module
68 Switch
70 Switch
72 Input
74 Output
76 Fault simulation cell
78 RC element
80 System component
82 Modification unit
84 Switch
86 Switch
88 Fault activation unit
90 Modification unit
92 Disconnection point
94 Modification unit
96 Resistor
98 Aircraft

The invention claimed is:

1. A system with a self-test function, comprising:
at least one system component having at least one technical function;
a fault simulation unit integrated in the system;
a self-test unit integrated in the system; and
a verification control unit integrated in the system,
wherein the at least one system component is coupled to the fault simulation unit,
wherein the fault simulation unit is configured to influence the operation of the system component to the effect that the at least one technical function is selectively impaired,
wherein the self-test unit is configured to monitor operating parameters of the system component and to respectively generate a warning signal indicating impairment of the respective at least one technical function, and
wherein the verification control unit is configured to compare the warning signals generated by the self-test unit with expected warning signals on the basis of the impaired technical functions,
wherein the at least one system component is an electrical or electronic system component, and wherein the fault simulation unit has at least one electronically controllable fault simulation cell integrated in the at least one system component and configured to selectively open a line of the relevant system component or to selectively close a connection of the relevant line to another line or to an additional electronic component.

2. The system according to claim 1, wherein the at least one system component has digital electronics.

3. The system according to claim 1, wherein the other line has an earth connection or a connection to the logic level "1".

4. The system according to claim 1, wherein the additional electronic component is selected from a group of electronic components consisting of:
- a resistor,
- a capacitance,
- an inductance,
- analogue filters,
- digital filters,
- logic modules,
- bridging lines, and
- voltage sources.

5. The system according to claim 1,
wherein the fault simulation unit has an external control unit and an internal control unit configured to be connected to the external control unit,
wherein the at least one fault simulation cell is arranged in the internal control unit and is configured to be controlled by the external control unit, and
wherein at least one of the at least one fault simulation cell or the internal control unit is configured such that the at least one fault simulation cell is not connected without a connection to the external control unit.

6. The system according to claim 1, wherein the at least one fault simulation cell has an electronic switch.

7. The system according to claim 1, further comprising at least one isolating unit for electrically isolating one of the at least one system component from other system components if necessary.

8. The system according to claim 1, further comprising a stimulation unit configured to be connected to the at least one system component and configured to simulate input variables for the relevant system component.

9. A method for checking self-test functions in a system, comprising:
influencing an operation of at least one system component by a fault simulation unit integrated in the at least one system component, with a result that a technical function is selectively impaired,
monitoring operating parameters of the system component by a self-test unit integrated in the system and generating a warning signal indicating impairment of the respective technical function,
comparing the generated warning signal with expected warning signals on the basis of the impaired technical functions by a verification control unit, and
outputting a warning notice if the generated warning signal does not correspond to an expected warning signal.

10. The method according to claim 9, wherein the process of influencing operation comprises selectively opening a line of the relevant system component or selectively closing a connection of the relevant line to another line or to an additional electronic component.

11. The method according to claim 9, further comprising electrically isolating the relevant system component at least while influencing operation.

12. The method according to claim 9, further comprising simulating input variables for the relevant system component by a stimulation unit configured to be connected to the at least one system component.

13. An aircraft having at least one system according to claim 1.

* * * * *